United States Patent [19]
Haskell

[11] Patent Number: 5,057,902
[45] Date of Patent: * Oct. 15, 1991

[54] SELF-ALIGNED SEMICONDUCTOR DEVICES

[75] Inventor: Jacob D. Haskell, Palo Alto, Calif.

[73] Assignee: Advanced Micro Devices, Inc., Sunnyvale, Calif.

[*] Notice: The portion of the term of this patent subsequent to Nov. 27, 2007 has been disclaimed.

[21] Appl. No.: 352,708

[22] Filed: May 11, 1989

Related U.S. Application Data

[63] Continuation of Ser. No. 127,820, Dec. 2, 1987, abandoned.

[51] Int. Cl.$^5$ .............................................. H01L 27/04
[52] U.S. Cl. ..................................... 357/71; 357/23.9; 357/23.11; 357/59
[58] Field of Search ................. 357/59 I, 59 H, 59 K, 357/23.9, 71 S, 71 P, 67 S, 54, 68, 42

[56] References Cited

U.S. PATENT DOCUMENTS

| | | | |
|---|---|---|---|
| 4,016,587 | 4/1977 | de la Moneda | 357/23.9 |
| 4,306,915 | 12/1981 | Shiba | 357/23.9 |
| 4,374,700 | 2/1983 | Scott et al. | 357/59 I |
| 4,450,470 | 5/1984 | Shiba | 357/675 |
| 4,543,592 | 9/1985 | Itsumi et al. | 357/71 |

Primary Examiner—William D. Larkins
Attorney, Agent, or Firm—David W. Collins

[57] ABSTRACT

A novel process is provided for fabricating transistors (14), contacts (46s, 40g, 46d) and interconnections (46c) in a novel self-aligned configuration. The process of the invention permits higher packing densities, and allows feature distances to approach 0.5 μm and lower. In a preferred embodiment, the configuration is also planarized. A unique combination of masks in conjunction with a multi-layer structure (28) formed on the surface of a semiconductor wafer (16), the multi-layer structure including a buried etch-stop layer therein (28b), defined the source (18), gate (22), and drain (20) elements and their geometry relative to each to each and to interconnects. Polysilicon plug (40, 46) contacts through slots in the multi-structure layer permit vertical contact to be made to the various elements. Silicidation (56) of the polysilicon plugs reduces series resistance in the vertical direction and permits strapping of N+ and P+ polysilicon plugs.

19 Claims, 8 Drawing Sheets

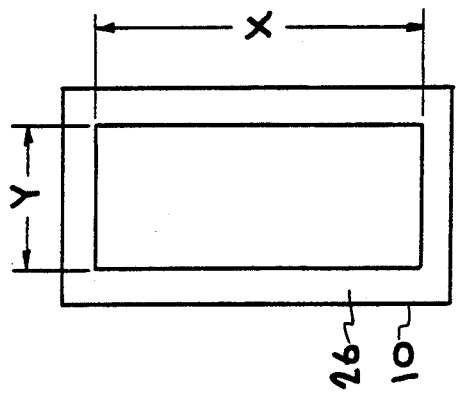
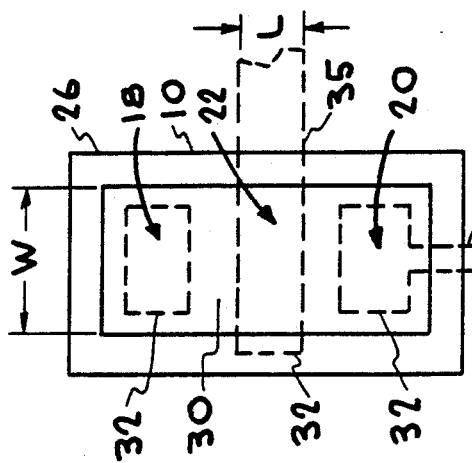
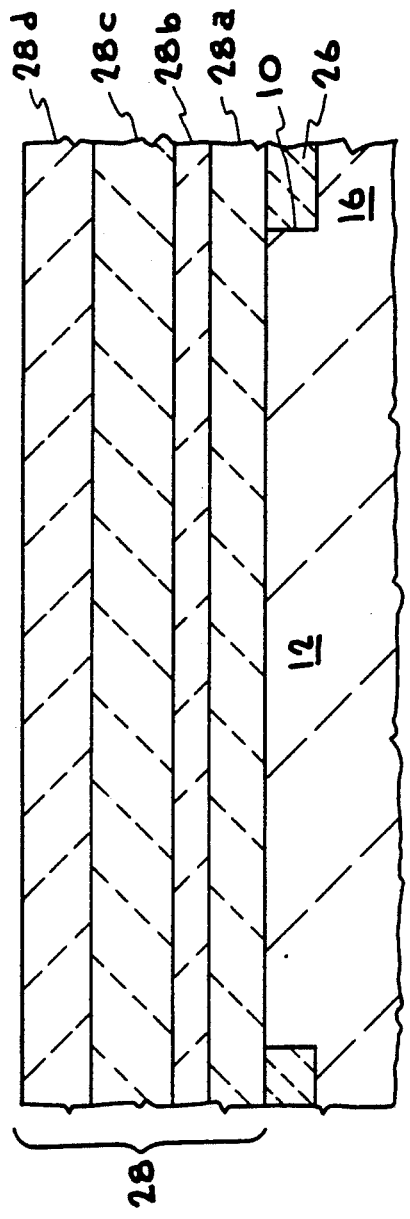
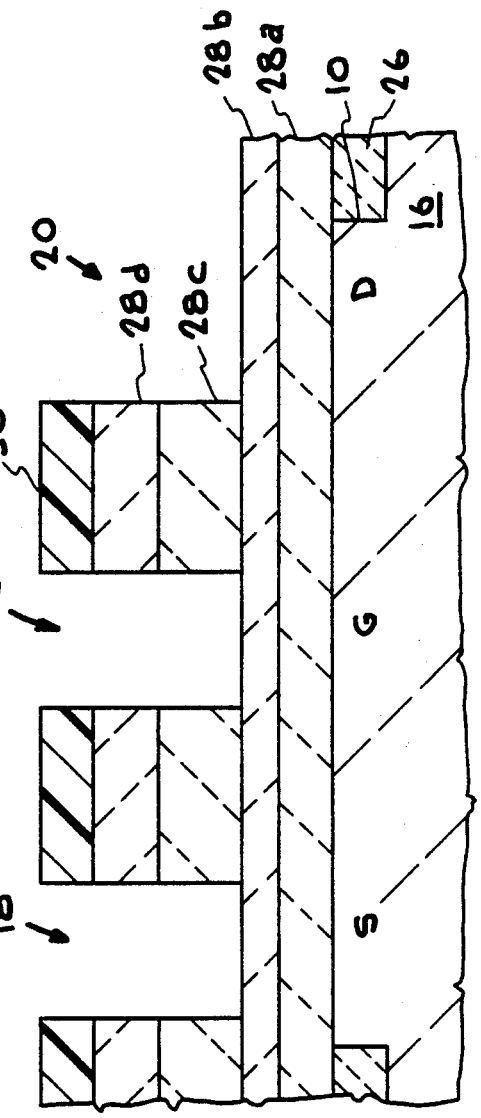

SELF-ALIGNED SEMICONDUCTOR DEVICES

This is a continuation of co-pending application Ser. No. 07/127,820 filed on Dec. 2, 1987, now abandoned.

BACKGROUND OF THE INVENTION

1. Field of the Invention.

The present invention relates to semiconductor devices, such as transistors, specifically, field effect transistors (FETs), and, more particularly, to a new device structure and process for preparing such devices, resulting in a completely self-aligned structure.

2. Background of the Invention.

The LOCOS (local oxidation of silicon) process for fabricating MOS (metal-oxide semiconductor) devices, especially CMOS (complementary MOS) is well-known and widely practiced throughout the semiconductor industry. It is a suitable process for design geometries greater than about 1 $\mu$m feature size.

However, as feature sizes are reduced to sub-micrometer dimensions to achieve higher packing densities of devices, several problems emerge.

First, the depth of focus of the lithography stepper becomes smaller. Thus, the different heights of different features generate a depth of field problem.

Second, the spacing of contacts to the polysilicon gate and to the field oxide becomes critical at smaller dimensions. It will be appreciated that due to the use of separate alignment steps, the margin of error in aligning the contact can, if not adequate, result in either (a) etching through the field oxide, with consequent shorting of the silicon substrate to the diffusion source or drain region by the contact, or (b) contacting the polysilicon gate, with consequent shorting of the gate to the source or drain contact.

Such misalignments are accommodated by allowing a substantial space between source, drain and gate and between source, drain and field edge. As a result, high packing density is sacrificed.

Another requirement of the present processing scheme is that the gate contact is made to an interconnect which extends at right angle to the source-gate-drain line. Such a contact requires considerably more area than a contact directly down to the gate. However, the use of separate alignments dictate the present processing scheme, in order to avoid potential misalignment problems.

Finally, a problem well-known in the art with the LOCOS process is the so-called "bird's beak" problem, which occurs where the field oxide tapers to the substrate in the source and drain regions. Such a taper results in an electrical width smaller than the mask dimensions.

It is evident that the profusion of different heights during processing and the several alignment steps prevent efficient use of advanced lithography processes and other processes to generate high packing densities of devices on a substrate, since the depth of field reduces with the smaller dimensions that are needed for scaling.

SUMMARY OF THE INVENTION

In accordance with the invention, a new device structure and process are provided. The process of the invention is intended to supplant the LOCOS process and employs total self-alignment to avoid most, if not all, the disadvantages associated with the prior art process. As a result, high packing densities may be achieved.

Self-alignment easily permits various components of the devices to be interconnected in any manner selected by the engineer, without the misalignment area penalties discussed earlier. The process of the invention permits the use of plugs of polysilicon, the tops of which can be contacted to reduce gate contact area requirements. Feature distances of 0.5 $\mu$m and less may be achieved by the process of the invention.

Preferably, planarization processes are employed. Planarization avoids the depth of field problem.

A unique combination of masks in conjunction with a multi-layer structure formed on the surface of a semiconductor wafer, the multi-layer structure including a buried etch-stop layer therein, defines the source, gate and drain elements and their geometry relative to each other and to interconnects. Polysilicon plug contacts through slots in the multi-structure layer permit vertical contact to be made to the various elements. Silicidation of the polysilicon plugs reduces series resistance in the vertical direction, and permits using both N and P poly silicon electrodes for device scaling of n- and p-MOSFETs.

In accordance with the invention, a semiconductor device, such as a CMOS device comprising a plurality of elements, is characterized by a plurality of plugs associated with the elements and comprising a conducting material, such as polysilicon, contacting the surface. At least some of the plugs terminate in a planar region above the surface, with at least some plugs contacted by a planar interconnect. The plurality of plugs having a constant dimension in at least one direction parallel to the substrate, and the plurality of plugs are mutually self-aligned with each other.

In the process of the invention, a self-aligned, planarized device having a plurality of device elements is formed using a buried etch stop. The process comprises:

(a) delineating an active area within which individual devices are made by forming an oxide region in the substrate therearound;

(b) forming a multi-layer structure on the surface, the structure including a buried etch-stop layer sandwiched between dielectric layers;

(c) using a mask in conjunction with a resist layer formed on the multi-layer structure and etching of undesired portions thereof to define a plurality of slots corresponding to various elements of the devices, thereby self-aligning the elements with each other;

(d) filling the slots with a conducting material and forming N and P regions in the substrate by implanting ions in regions underlying the slots;

(e) removing upper portions of the conducting material where no contact thereto is desired; and (f) forming a metallic layer to contact those portions of the polysilicon where contact is desired.

For forming a planarized structure, after Step (e), any open regions are filled with a planarizing material, leaving the surface of portions of the conducting material to be contacted in the same plane as that of the planarizing material. The metallic layer is then formed on the planarizing material to contact the portions of the conducting material in the same plane as that of the planarizing material.

Other objects, features and advantages of the present invention will become apparent upon consideration of the following detailed description and the accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

FIGS. 1-14 depict the sequence of events in the process of the invention, with the "a" designation depicting cross-sectional views and the "b" designation depicting top plan views.

DETAILED DESCRIPTION OF THE INVENTION

Figure 1A:
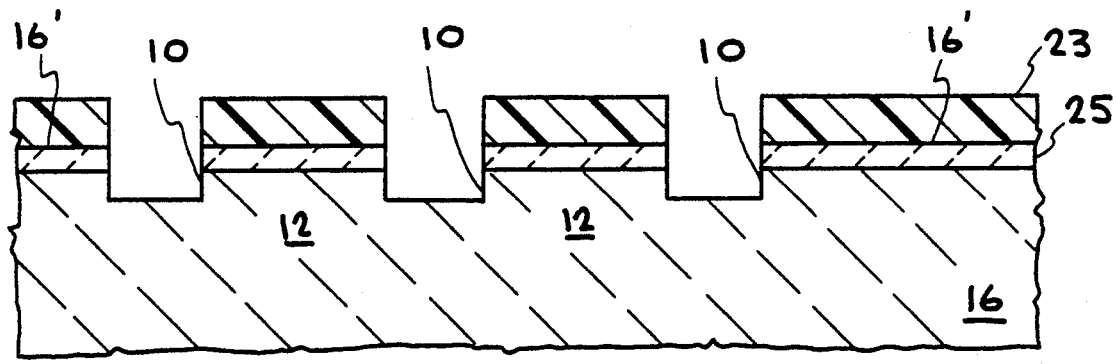

Reference is now made in detail to a specific embodiment of the present invention, which illustrates the best mode presently contemplated by the inventor for practicing the invention. Alternative embodiments are also briefly described as applicable.

The process of the invention, in its preferred form, is totally non-LOCOS. However, it will be appreciated by those skilled in the art that portions of the process may be incorporated in the present LOCOS process to realize the benefits disclosed herein. Further, while the process of the invention is directed specifically to employing silicon as the semiconductor, it will be clear to those skilled in the art that the teachings of the invention may be extended to other semiconductors, with suitable modifications in etchstop layers and the like.

The process of the invention begins with the formation of an isolation trench 10 surrounding the area in which a device, (here, an MOS transistor 14, seen in FIG. 11a), is to be fabricated in a P-well or N-well region 12 in a semiconductor substrate 16. There are a plurality of such isolation trenches 10, one associated with each device 14.

Figure 10A:
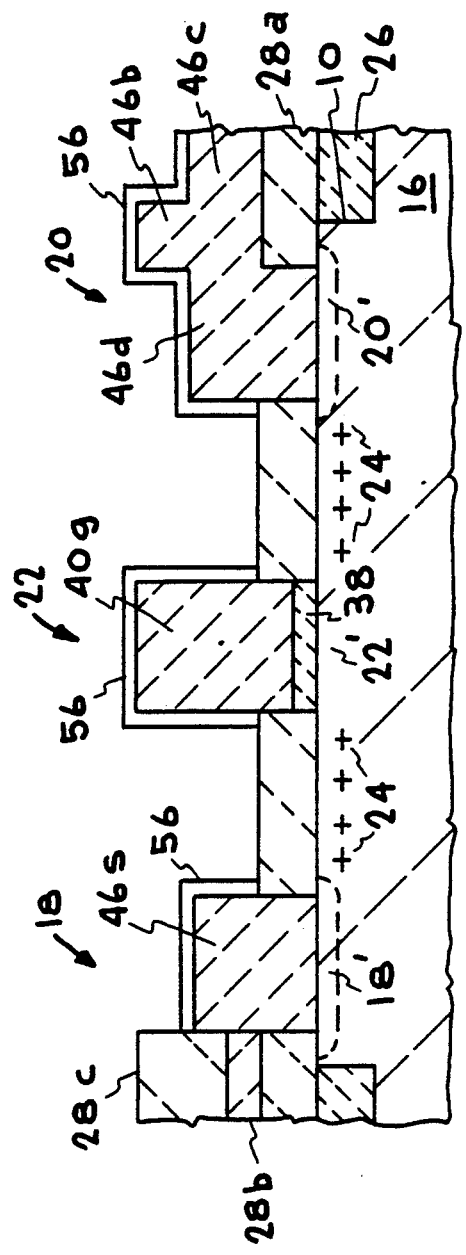

As is well-known, such transistors 14 comprise source 18 and drain 20 elements, with a gate area 22 therebetween to regulate the extent of a channel 24 therebetween (seen in FIG. 10a). The formation of P-wells and N-wells is known, and hence does not form a part of this invention.

Figure 2A:
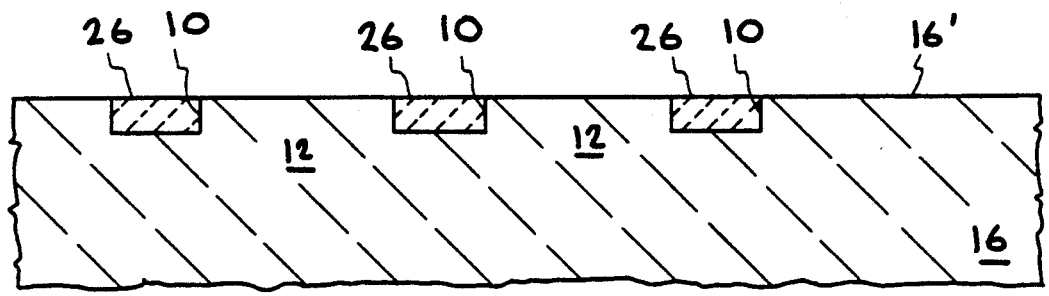

As shown in FIG. 1a, a plurality of trenches 10 surrounding well regions 12 in a semiconductor substrate 16 are etched through a resist mask 23 formed on top of a nitride mask 25 formed on the surface 16' of the substrate. The resist 23 and the nitride 25 are then stripped and the trenches 10 are filled with an oxide 26, as shown in FIG. 2a.

The etching of the trench is done employing well-known processes, such as an RIE (reactive ion etch) process followed by suitable wet silicon damage removal etches. The oxide 26 used to fill the trenches 10 may be a low temperature oxide or a preferred 750° C. TEOS (tetra-ethyl ortho silicate). The oxide is etched back to be planar with the surface 16' of the silicon substrate 16. The planarizing is done by a combination of chemical and reactive ion etching processes commonly used in the art for oxide planarization.

The isolation trench 10 is created by etching a four-walled trench to outline an active region of the appropriate length (X) and width (Y). In the process of the invention, the trench 10 has a rectangular configuration, when viewed in top plan view (FIG. 3b), defining an active area (X×Y) of about 5 μm by 2 μm (for 1 μm design rules).

The isolation trench is typically about 0.5 to 1 μm wide and about 0.4 to 0.6 μm deep. The size is governed by lithography alignment constraints and filling of the trenches by subsequently deposited oxide.

While one complete trench is shown in the FIG. 3a, it will be appreciated that a plurality of such trenches is employed on a single semiconductor substrate 16, as shown in FIG. 2a, each delineating an active area of a device. Of course, as the technology of feature definition continues to improve with new resists and resist development processes, these dimensions will also decrease.

Next, a specific sequence of layers 28 is formed on the surface of the substrate 16, as shown in FIG. 3a. The particular sequence of layers 28 is the crux of the invention. This multi-layer structure includes a buried stop-etch layer, essential in the practice of the invention.

First, a field oxide 28a, having a thickness of about 2,500 Å±5%, is formed on the surface of the substrate 16. The thickness of the field oxide 28a can be targeted consistent with the field threshold voltage required and subsequent implant energy available for forming N$^-$ and P$^-$ connectors, described below.

The formation of the field oxide 28a in itself is not novel, and is formed by a conventional deposition process to the required thicknesses. The thickness selected depends upon the implant energy needed to implant therethrough versus the polysilicon left to block the implant, as discussed below in connection with FIG. 10a.

Ideally, the field oxide 28a should be as thin as possible consistent with the required field inversion voltages. Also importantly, the thickness of this layer 28a should be substantially uniform across the surface of the wafer, in order to best realize the benefits of the invention. For silicon-based devices, the field oxide comprises silicon dioxide.

Next, a thin layer 28b of an etch-stop material is formed on the field oxide 28a. The etch-stop material 28b comprises a material having a significantly different etch rate from silicon dioxide and is important in the practice of the invention, as will be seen below. For silicon-based devices, a suitable etch-stop material comprises silicon nitride, having a thickness of about 800 Å±5%. The nitride can be deposited by LPCVD (low pressure chemical vapor deposition) or PECVD (plasma-enhanced CVD). The minimum and maximum thickness depend on the etch uniformity of the process and apparatus.

Figure 8B:
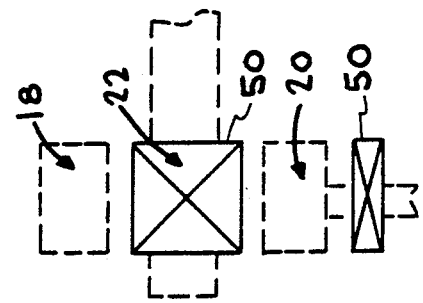

Over the nitride layer 28b is formed another layer 28c of oxide, ranging in thickness from about 5,500 to 6,500 Å. This oxide layer is conveniently formed in the same manner as the field oxide. This oxide layer 28c governs the depth of polysilicon plugs to be formed as discussed below and governs what remains of the polysilicon layer (interconnect polysilicon) following etch-back at the anti-contact mask, also discussed below, in connection with FIG. 8b. Thus, the thickness of the oxide layer 28c must be greater than the sum of about 4,000 Å of polysilicon removed and the residual interconnect thickness needed (about 2,000 Å) at that stage.

Figure 5B:
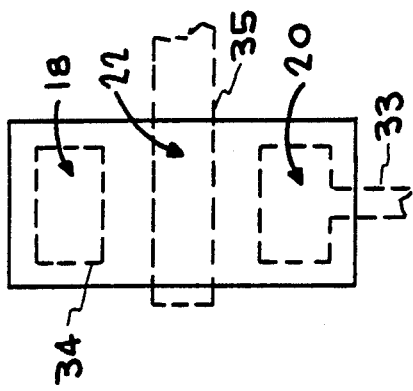
Figure 5A:
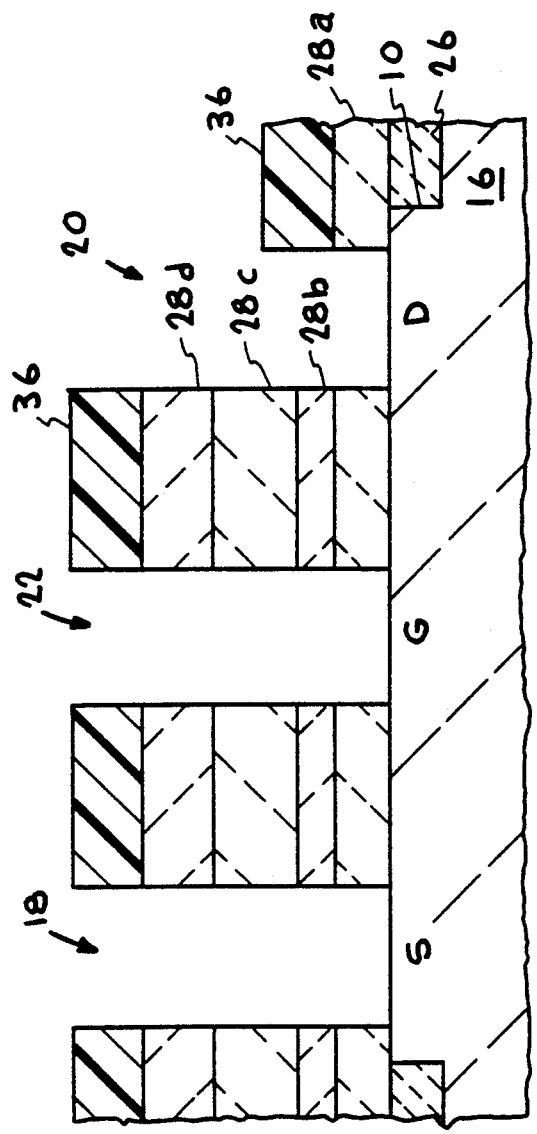

Finally, a layer 28d of polysilicon is formed on the oxide layer 28c to a thickness ranging from about 2,000 to 2,500 Å. This layer 28d has a dual purpose: it serves both as an etch mask and as a lithography "enhancement" layer, as explained in connection with FIG. 5b.

While materials other than polysilicon may be used that have a good etch ratio to silicon dioxide, such as silicon nitride, polysilicon has several advantages. First, it has uniform reflectivity so that lithography is easier to control. Second, it has a better than 20:1 etch ratio to silicon dioxide so that it doubles as an etch mask even if overlying resist gets eroded away during the subsequent etching, thereby preventing dimension control losses.

The foregoing layers 28a–d may be sequentially deposited in one pump-down to reduce defect density.

A layer of resist 30 is next formed on the top polysilicon layer 28d and is exposed to a "slot" mask (dashed lines 32 in FIG. 4b), which simultaneously provides for mutual self-alignment between source 18, gate 22 and drain 20 regions. The slot mask 32 may also include provision for contact to other devices via extension 33 and for contact to the gate 22 via extension 35 and any other combinations thereof. It is a total level of interconnect, compared to conventional polysilicon, which is a half level. (The conventional half-level requires another level of interconnect to complete the connections.) In this manner, packing density of devices may be increased by nearly 50% over that of the prior art LOCOS process without critical alignment requirements. Further increases in density may be achieved as the technology of finer resist definition develops.

The slot mask defines the polysilicon interconnect areas in the field and the source/gate/drain areas of all the devices. The slot masks can be at minimum feature and minimum feature spaces that may be defined lithographically. As can be seen, the source/gate/drain areas are self-aligned with each other so far.

The resist 30 can be exposed by electromagnetic radiation (visible, UV, X-ray, as appropriate), as is conventional, and the undesired portions of the underlying four layers 28 are removed, such as by etching, to expose portions of the semiconductor substrate 16 corresponding to the source 18, gate 22 and drain 20 regions.

The four layers 28 are etched as follows: First, the exposed portions of the polysilicon layer 28d are etched using an RIE etcher, followed by etching the exposed portions of the oxide layer 28c, again, using an RIE etcher. This latter etch stops at the nitride layer 28b, since the etch rate of the oxide can be adjusted with etch parameters to be about five times that of the nitride. This method of etching allows controlled manufacturability of the etch, since the nitride layer 28b acts as a built-in "buried" etch stop.

The two etchings (of layers 28d, 28c) may be performed in one pump-down. At this point, the nitride layer 28b may be etched to the field oxide also, if it is desired to remove nitride from underneath the polysilicon layer 28d eventually.

The RIE etch process employs a mixture of oxygen and fluorinated gas, such as $CHF_3$, $CF_4$, $NF_3$, and the like. Controlled etch ratios between oxide and nitride are achieved by varying the ratio of the gases and, in some instances, the power of the etcher. The RIE etch process is well-known and thus does not per se form a part of this invention.

The resist 30 is stripped and the wafer is remasked, using an "active" mask (denoted by solid lines 34 in FIG. 5b, the trench 10 being omitted for clarity) in conjunction with a new resist layer 36. The purpose of this mask is two-fold. First, in the source 18/gate 22/drain 20 areas, the etch is completed to silicon or to the exposed oxide in the slots. Some of this exposed oxide in the trenches 10 will be etched ($\approx 500$ Å), corresponding to the required over-etch needed to clear the field oxide areas in the source 18, gate 22, and drain 20 openings down to the silicon substrate 16.

In the field areas or interconnect areas over the field, the mask covers this with resist and prevents etching. In this manner, the oxide 28a in the field region is ultimately retained under the polysilicon extensions 33, 35 in the field region, which is outside the area enclosed by the isolation trench 10 (including the trench oxide 26). This forms the polysilicon interconnections.

The exposed portions of the nitride layer 28b are then etched, stopping on the field oxide layer 28a, again using RIE. The etch ratio is adjusted to greater than about 3:1 nitride to oxide. The exposed portions of the field oxide layer 28a are then etched, to expose portions of the underlying silicon 16. Again, as indicated above, the etching of the nitride layer 28b and oxide layer 28a can be done sequentially in one pumpdown in the same etcher, merely changing chemistry to accommodate the nature of the respective layers.

With an oxide-to-nitride etch ratio of $\geq 3:1$ and a non-uniformity of etch of $\pm 10\%$ and of the oxide layer 28c of $\pm 10\%$ and with the thickness of the oxide layer ranging from about 6,000 to 7,000 Å, it is possible to over-etch layer 28c and still stop on or in the nitride layer 28b. This gives in itself a large manufacturing advantage. In the prior art methods of etch-back, a "timed etch" would not overcome non-uniformity problems. A laser end-point method samples one wafer in a batch machine and is subject to the same uncertainties. Thus, the use of the "buried etch stop" nitride layer 28b is seen to provide a unique solution to yet another etch sequence that enhances the process of the invention. A second etch then removes the nitride layer 28b, stopping on the field oxide 28a.

With the completion of the etching down to silicon, the width W of the device has been defined by the trench mask 10 in FIGS. 3b and 4b as Y = W. The length of the channel (geometric), denoted L, has already been defined in the first etch, using the slot mask 32. Thus, the source 18, gate 22 and drain 20 regions have been defined geometrically, together with the device length L of the channel under the gate and the width W under the gate. Further, interconnect slots, such as shown in conjunction with the drain 20 region (denoted 33 in FIG. 2b), are also defined.

Figure 6A:
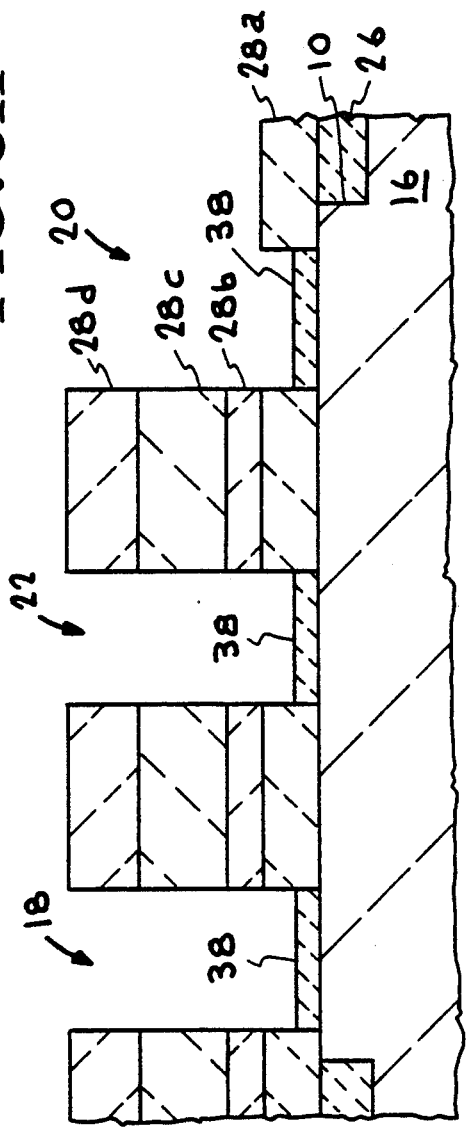

After etching through the field oxide layer 28a, the resist layer 36 is removed in a conventional manner and a thin oxide film 38 (the gate oxide) is grown in the exposed portions of the semiconductor substrate 16 (FIG. 6a). The gate oxide 38, as is conventional, is formed to a thickness of about $150 \pm 10$ Å, or less, depending on the scaling of the devices.

Figure 7B:
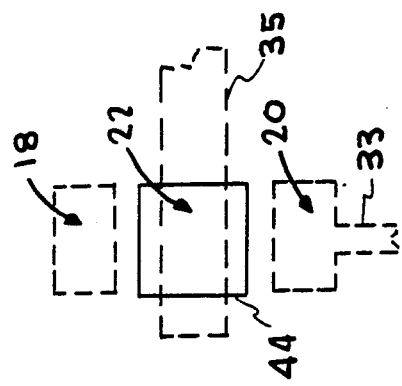
Figure 7A:
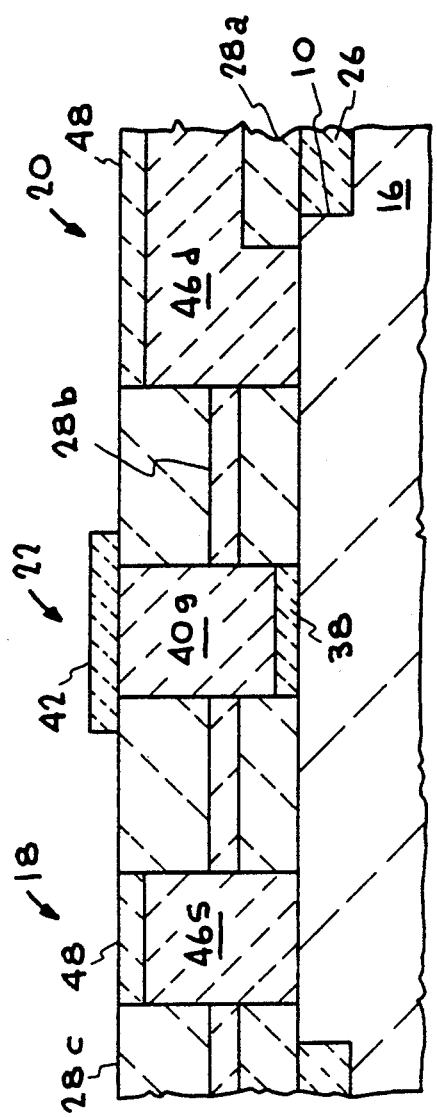

A source/drain etch-out mask (denoted by solid lines 44 in FIG. 7b) is used to cover and protect the n-MOS and p-MOS gate areas, as shown at 42 in FIG. 7a. Next, those portions of the gate oxide layer in the source 18, drain 20 areas are removed such as by a wet etch dip or by RIE etching or a combination thereof. The resist is then stripped off the wafer.

A polysilicon layer is blanket-deposited to a thickness of about 7,000 Å $\pm 5\%$ (for 1 μm feature widths) and then etched or polished (chemical/mechanical) back to stop on the upper oxide layer 28c. The polysilicon fills all the source 18, gate 22 and drain 20 slots, as well as all the interconnect slots 32. (The polysilicon filling the gate 22 slot is denoted 40g in FIG. 7a).

The polysilicon layer is polished back (chemical/mechanical), using the same apparatus as in silicon wafer polish, to planarize the polysilicon.

Next, a doping cycle is performed. In this doping cycle, the polysilicon gates 40g are not doped until the end of the process.

To this end, an oxide layer 48 is formed everywhere, for example, thermally grown at about 900° C., typically to a thickness of about 125 Å±10%. This doubles as an ion implantation screen and a nitride etch stop, and accordingly, the thickness is governed by these considerations. $B_{11}$ ions are implanted to give P+ doping into the polysilicon plugs 46s, 46d over P-channel sources and drains of the devices, respectively, as well as the N+ areas that are open. Where it is desired to form N+ doping, a nitride layer 42 about 600 to 800 Å (sufficient to mask $POCl_3$) is deposited, masked using the N+ mask, and etched away together with the 125 Å oxide layer 48 underneath to stop on polysilicon to expose N+ regions, which are then counter-doped with $POCl_3$ (these regions were previously doped with boron).

The N+ and P+ 44 masks (shown in FIG. 7b) are configured as follows, employing resist as the P+ mask (P-MOS devices) and nitride as the N+ mask (N-MOS devices). As seen in FIG. 7a, the masks 42 protect the gate areas 22 against doping.

The masks 44 are identical, except that the P+ mask covers the NMOS areas completely and also covers the P+ gate areas. The N+ mask covers the PMOS areas completely and also covers the N+ gate areas. This is different compared to conventional N+/P+ masks, wherein the source, gate and drain are all of the same doping; that is, the NMOS/PMOS areas are completely opened and the gates are not protected.

It will be recalled that the N and P wells 12 are already in place prior to trench formation. Of course, the source and drain polysilicon plugs of each isolated region or device 14 are doped to a conductivity opposite that of the well 12 of that region, except where contacts to these are needed, they are then the same conductivity.

Figure 8A:
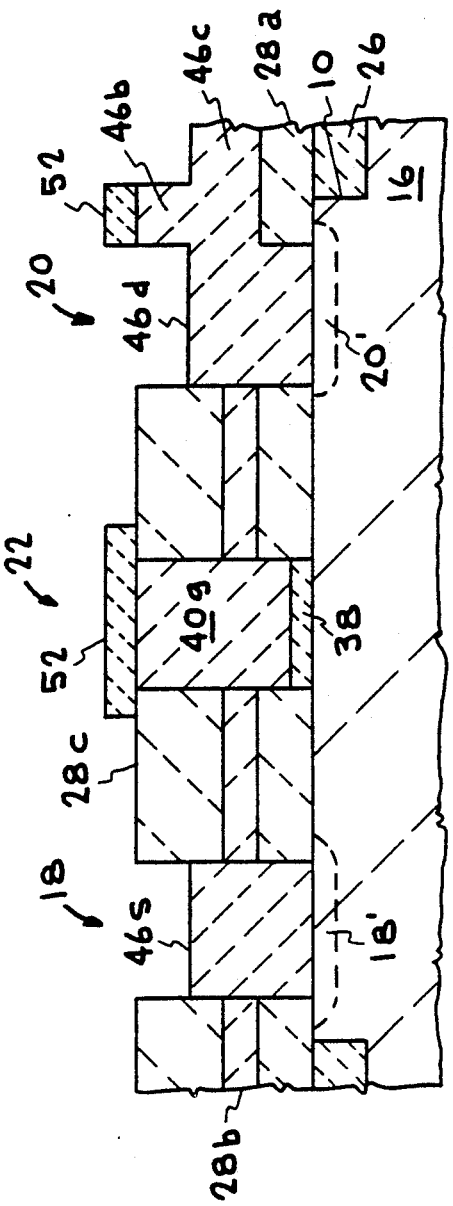

The assembly is heated to about 900° C. for about 60 min., to drive the dopants to form N+ and P+ junctions/regions for both sources 18 and drains 20 in the semiconductor. For example, as seen in FIG. 8a, doped regions 18', 20' are formed by the drive. The temperature and time may be varied, depending on the plug depth and junction depth needed. Alternatively, a rapid thermal anneal may be used to drive the junctions.

The gate is still undoped, since doping the gate polysilicon 40g would result in the dopant species penetrating the thin gate oxide 38 to the underlying semiconductor 16, and causing potential reliability problems.

The masking nitride cap 42 is next removed over the gate areas 22.

At this stage, it is seen that the three layers (field oxide 28a, nitride 28b, and oxide 28c), are planarized, with planarized polysilicon plugs 46s, 40g, 46d to sources 18, gates 22, and drains 20, respectively, on the semiconductor substrate 16. All sources, gates, drains and interconnects are mutually self-aligned. After the definition and drive of the plugs, a novel contact scheme, as described in detail below, can be implemented.

The devices now must be connected to the gate edges, as will be described in detail below. The following discussion involves the formation of contacts directly over the gate electrode 40g without degrading the gate oxide 38. This configuration permits scaling of the feature sizes.

In conventional LOCOS technologies, the thickness of the polysilicon over the gate areas has to be scaled down to present reasonably planar or small step heights, as the aspect ratios get worse. A contact cannot be made directly on this gate over the gate oxide without degrading the gate breakdown.

Thus, another aspect of the novel approach of this invention is that it allows a planar surface to be present at the contact-making step and at the metal deposition step immediately following it, which affords a manufacturing advantage at small geometries. The inventive approach also makes refill technologies and methods less demanding than conventional methods.

An "anti-contact" resist mask (denoted by the crossed areas 50 in FIG. 8b) is formed as a layer 52 on the polysilicon layers 40g, 46s, 46d and patterned to cover the gate polysilicon 40g and other desired regions of connectors, such as a portion of the drain polysilicon 46d. In the anti-contact mask 50, resist is left where the contacts are required, as distinct from a conventional contact mask where these contact areas are normally opened.

Next, the exposed portions of the polysilicon layer 46 are etched with a timed etch to remove a specific amount of polysilicon, using an etchant that has good selectivity to the underlying oxide is non-preferential with respect to N+, P+, or undoped polysilicon. An example of such an etchant is chlorine-based plasma chemistry. In particular, about 4,000 Å±5% of polysilicon is removed. This amount will be the interoxide thickness between the polysilicon and metal and is governed by capacitance considerations. Also, the contacts can overlap the oxide because the RIE polysilicon/oxide ratio evidences >20:1 selectivity. The contacts that are being defined are features in the resist and not openings in the resist as in conventional contact schemes, making lithography easier.

The resulting structure is shown in FIG. 8a. It will be seen that the polysilicon interconnect 46c in the field is recessed by the etching as well as all those areas not to be contacted, such as source polysilicon 46s.

Figure 11A:
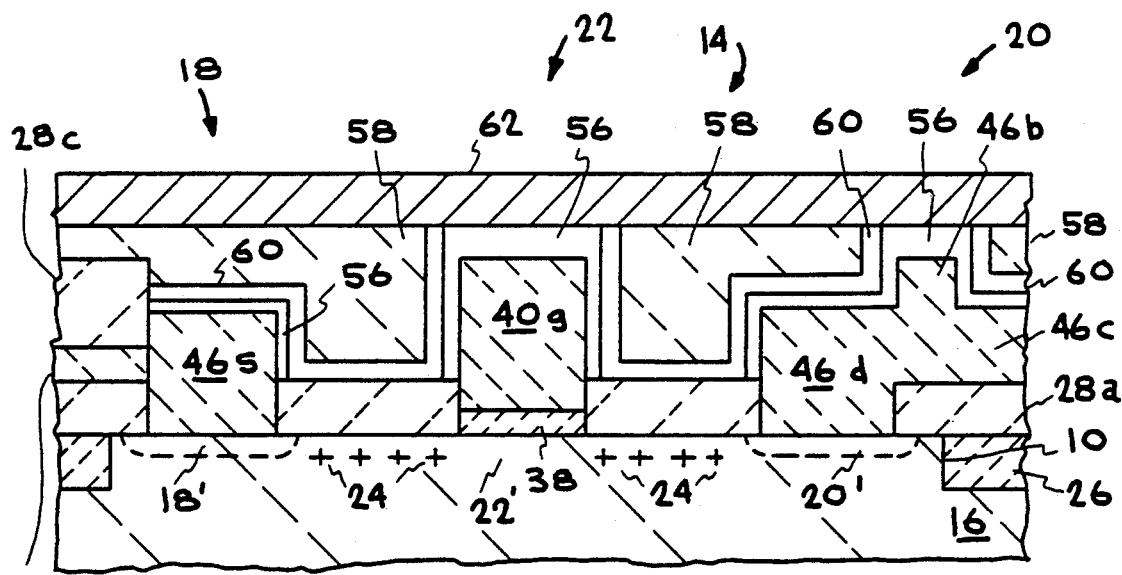

All the etched back areas at this stage have a similar width in one direction. The polysilicon in the field is the width of the slot in which it resides (parallel to the plane of FIG. 8a). It is thus easy to fill these areas with spin-on glass to obtain a very flat topology as shown in FIG. 11a and as discussed in further detail below.

The patterned resist 52 is removed, leaving "buttons" of polysilicon 46b, as well as contact to gate "button" 40g.

Figure 9B:
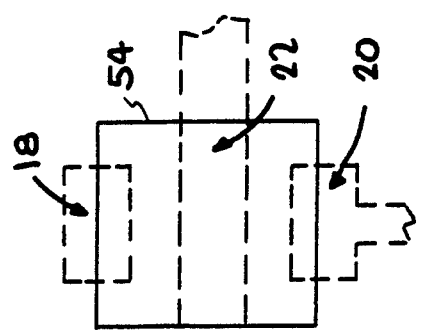

A connector mask (denoted in FIG. 9b by solid lines 54) is employed to define portions 55 of the oxide layer 28c by use of a resist layer 57. These portions 55 are removed by etching, using the underlying nitride layer 28b as an etch stop. The exposed portions of the nitride layer 28b are then removed by etching, stopping on the field oxide layer 28a.

It should be noted that this etch is identical to that discussed above in forming the interconnects and has all the advantages referred to therein.

Implantations of appropriate ions (for N and P channels 24 connecting source 18' and drain 20' to the gate 22' edges) are then done through the exposed portions of the field oxide 28a to connect and form the transistors (N- and P-type). It will be noted that the oxide to be implanted through is the field oxide 28a, which has been deposited to a well-controlled thickness, as described above.

The wafer is now implanted, using the P-mask, with either $B_{11}$ for the p-channels ($\approx 100$ keV at $5 \times 10^{14}$ cm$^{-2}$) or phosphorus, using the N-mask, for the n-channels ($\approx 250$ keV at $5 \times 10^{14}$ cm$^{-2}$). The operation is done using the sequence of P-mask and etch, P-implant, resist strip, N-mask and etch, N-implant, and resist strip. The source 18'/drain 20' junctions are now connected to the gate region 22' (seen in FIG. 10a), completing the MOS FET device 14. The channels 24 are denoted "+".

Due to scattering at right angles to the implant direction, there is advantageously an implant "tail" underneath the gate edges that results in a graded junction. This is beneficial for reducing hot electron effects for short channel devices, as is well-known.

During the channel implantation, the gate polysilicon plugs 40g are also lightly doped with the same implant. The doping is driven slightly, such as at about 800° to 1,000° C. for 15 to 30 seconds, by a rapid thermal anneal. This process activates the implants in the channels 24 but does not cause excess diffusion of the implants, thereby avoiding penetration of the gate oxide 38. (The faster diffusion rates in polysilicon, however, allow substantially uniform doping of the gate polysilicon with this short cycle.) In this manner, both P and N polysilicon plugs over the gates are formed. As is well-known, the formation of P+ polysilicon over thin gates (100 to 150 Å) has not heretofore been reliably accomplished in the prior art.

The exposed portions of polysilicon are selectively silicided, such as with TiSi or CoSi$_2$. The silicidation 56 covers the tops and exposed side portions of the polysilicon buttons or plugs 40g, 46s, 46d, 46b, as seen in FIG. 10a. The silicidation process conveniently comprises blanket-sputtering titanium to a thickness of about 500 to 800 Å and heating to about 650° C. by rapid thermal annealing. Desirably, a sheet resistance of about 2 to 4 $\Omega$/square is obtained.

The silicidation is a selective process. The reaction occurs with silicon or polysilicon only. The non-reacted deposited titanium is stripped in a wet chemical solution. The silicide is then rapid thermal annealed again to about 800° C. to provide the required resistance.

While not essential to reduction of the plug resistance, it is essential to strap the intersection of N+/P+ polysilicon plugs to give a non-diode ohmic contact. The strapping also shunts the series resistance of each polysilicon plug and polysilicon interconnect. Thus, the resistance of each plug is a function only of the thickness of the field oxide 28a, which is substantially constant over the entire wafer, as seen in FIG. 10a.

The strapping of polysilicon plugs may be done to any of undoped and doped (N+, P+) plugs.

Next, a plasma-enhanced chemical vapor deposition of oxide, about 1,000 Å, is used to form layer 60 on the silicided regions.

Spin-on glass 58 is then applied everywhere to the surface to fill the etched-out areas. Since all slots are of similar dimensions, then all slots are evenly filled and etched back (RIE) or polished back to the polysilicon plug surfaces as needed. Due to the different etch rates between the two layers 58, 60, planarization is enhanced. The result is a planar topology, with the surfaces of the "buttons", e.g., 40g, 46b, exposed.

It will be appreciated that the use of spin-on glass (SOG) with slots of similar width successfully overcomes the problems of trying to fill features of largely varying sizes with SOG. If large areas are attempted, the SOG fills in a "catenary" and is not flat. Since the SOG is also the inter-oxide thickness between the polysilicon and a metal layer (to be deposited next), this thickness control directly affects capacitance and performance, both of which are dealt with by this method.

The device as formed by the teachings herein has low overlap capacitance. By employing the planarized contact scheme discussed above, the gate 22/drain 20 Miller capacitance which is formed by the parallel placement of the source/gate/drain plugs can be reduced and accurately controlled/modeled. (A reduction in capacitance is obtained as a consequence of etching the polysilicon back in those areas where no contacts are needed.) While an additional Miller capacitance will occur where contacts are made to adjacent electrodes on the same device compared to plugs that are etched back, this is a small penalty for the much increased density.

Finally and perhaps most importantly, the contacts in this scheme are made where the poly is the thickest, for example, in FIG. 11a over the gate electrode 40g, which is a unique feature of this approach, giving a powerful density advantage. In the prior art, the gate is connected over LOCOS areas in a LOCOS technology because of items already discussed and thus use up more area. In addition, the scheme of the invention affords more reliable contacts to shallow junctions because metal contacts are made to plugs of poly. These can be selectively silicided prior to metal deposition and etch, as described above.

Figure 12A:
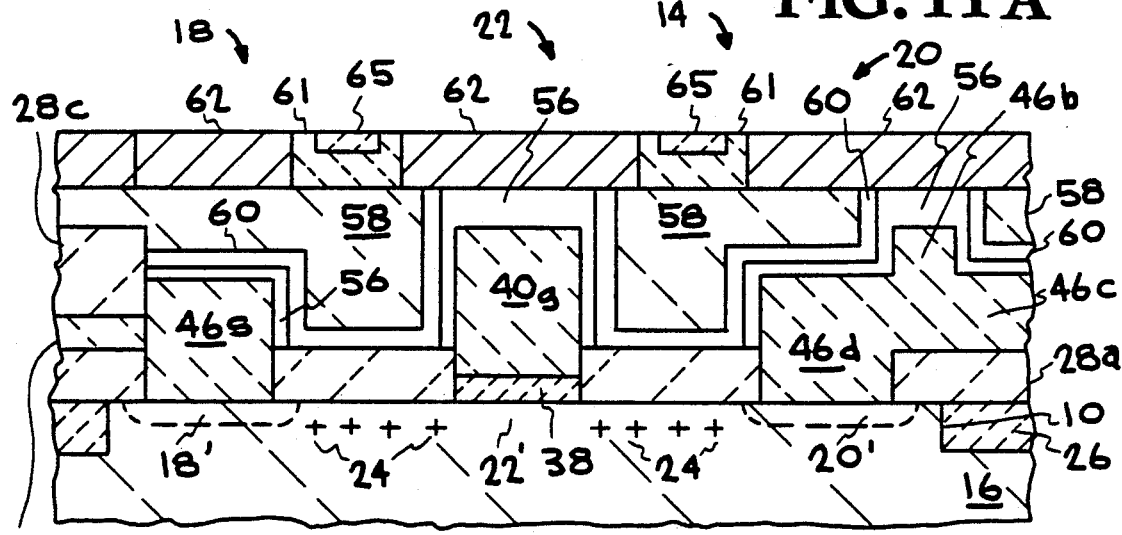

Next, as shown in FIG. 12a, a metal layer 62 is deposited over the entire wafer. The metal 62 contacts the raised polysilicon plugs, or buttons, here, 40g and 46b, via the silicide 56. The metal is patterned and etched as is conventional, the flat topology requiring less of an over-etch, overcoming bridging and yielding fewer problems than conventional schemes.

The etched portions of the metal layer 62 are lined with an oxide 61, such as PECVD oxide, and filled with a planarizing material 65, such as spin-on glass. In this manner, metal portions 62 are physically and electrically isolated from each other.

Figure 13A:
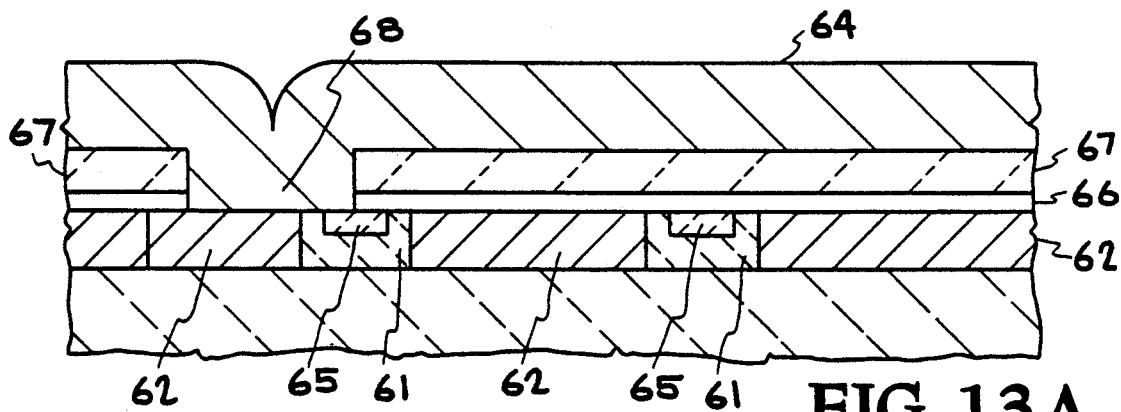

To form a second layer 64 of metal, shown in FIG. 13a, the spin-on glass (layer 65) (or any other planarizing layer) may be employed to planarize the first metal layer 62 and etched or polished back to the surface of layer 62, as above. A thin nitride layer 66 is deposited on the planarized glass and metal layers 62, 65, followed by formation of a contact oxide layer 67 thereover.

Figure 14A:
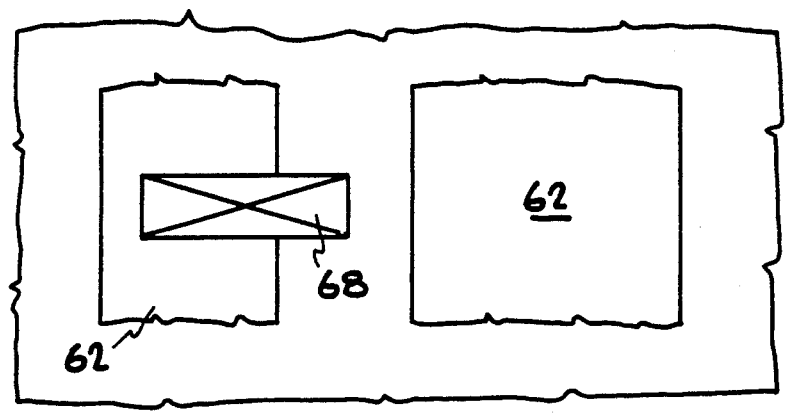

Etching of the contact 68 is then done through the oxide 67 to the nitride 66, again using the nitride layer as an etch stop, followed by etching of the nitride to expose portions of the underlying metal 62. Again, the two etches are performed in one step. If there is any misalignment, the underlying spin-on glass layer 66 will not be over-etched (see FIG. 14a). Also, the contacts can be drawn to overlap metal portions 62 to enhance lithography without over-etch problems.

It will be appreciated that the resulting metal area to form the contact is less than the so-called prior art "dog-bone", or framed, contact.

Any conducting material may be employed for the first metal layer 62 and the second metal layer 64. While aluminum is preferably employed, other conducting materials, such as tungsten, molybdenum and others well-known in the art may alternatively be used.

By employing a planarization method such as selective growth of tungsten to the first metal 62, it is possible to "plate up" the contacts 68 to form a planar surface prior to the deposition of the second metal 64.

As distinct from LOCOS processes that have different contact heights to the first metal 62 (over field and to devices), this technology is easier to fill to planar form. The LOCOS technology would be a compromise between the shallow depth and deep depth. If the deep contact is filled, the shallow one will have a pillar of tungsten sticking up that would have to be etched back.

To make this method of selective tungsten plating work without additional etch-back requires a flat surface with nearly equal contact depths. Also, the process can be repeated for subsequent levels of metal, provided a reasonable job of planarization is done, which again is easier with the process of the invention than with other processes.

There are several aspects of the foregoing novel process that should be noted.

First, the gate electrode is thick. Thus, no penetration of the gate electrode by etchants is possible, due to the presence of grain boundaries, which permit penetration. This is in direct contrast to prior art thin gate polysilicon electrodes, which are far more susceptible to wet etches, reactive ion etching and the like.

Second, the interconnects are all self-aligned. One mask defines all source, drain, and silicon surface contacts to silicon and all gate contacts to the gate oxides.

Third, the source and drain regions, the channel connector regions and the channel are all self-aligned in each transistor, as a consequence of the use of one mask.

Fourth, the process of the invention, using the mutual self-aligned scheme, permits scalability to ever smaller dimensions, limited only by the capability of lithography.

Finally, a consequence of utilizing the preferred process of the invention is that interconnects and contacts are planarized. However, planarity is not essential for interconnects, e.g., 46c, from one device to the next. On the other hand, while contacts such as 40g, 46d need not be fully planarized, they must be at least partially planarized, in order for contact to be made thereto by the overlying metal layers, such as metal layer 62.

A number of modifications of the main process of the invention may be made.

In one modification, tungsten may be used in place of polysilicon, such as for the source/drain contacts and for the interconnects. If tungsten is employed, then the process should be modified to implant the substrate first, then deposit tungsten. In this modification, any polysilicon used, such as in the gates, would also be deposited after implant of the substrate, and any subsequent implant would be to dope the polysilicon, not to form any junctions. The intersection of the polysilicon gates and tungsten interconnect will be ohmic, due to the formation of tungsten polysilicide at this intersection.

Or, N+ and P+ polysilicon plugs could be deposited in situ, such as by depositing N+ polysilicon everywhere, etching out the doped polysilicon from those areas where it is not desired, then depositing P+ polysilicon everywhere and polishing back.

In another modification, the gate polysilicon 40g could be doped the same time as the source and drain doping. However, such a modification requires one to be careful in subsequent processing, due to temperature and the presence of hydrogen atmospheres, which affect stability and reliability of P-channel devices, as discussed earlier.

As described above, the process of the invention preferably begins with formation of the isolation trench 10, which is filled with oxide 26, to delineate devices. However, it will be appreciated by those skilled in the art that while the process of the invention is most preferably employed to completely replace the well-known LOCOS process, various elements of that process may be integrated into the process of the invention.

Figure 15A:
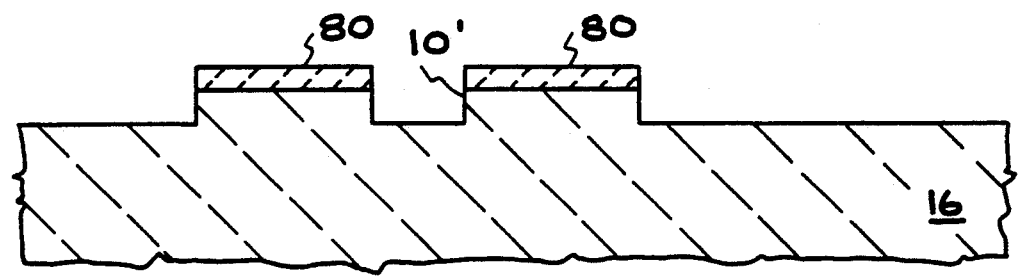
FIGS. 15-19 depict alternate embodiments in various process sequences.

For example, a "recessed oxide" scheme, which is a variation of the LOCOS process, may be utilized in place of the trench, or "picture frame" scheme of the invention. The alternate process, compared with the process of the invention, is as follows:

First, the P/N wells 12 are delineated, as in the process of the invention. Next, however, instead of using the isolation mask, which defines the "picture frames" and field (interconnect) areas, as shown in FIG. 1a, an isolation mask 80 identical to that currently used in conventional LOCOS processing is employed. The result is depicted in FIG. 15a, and can be viewed as a "variable width" picture frame technology.

Figure 16A:
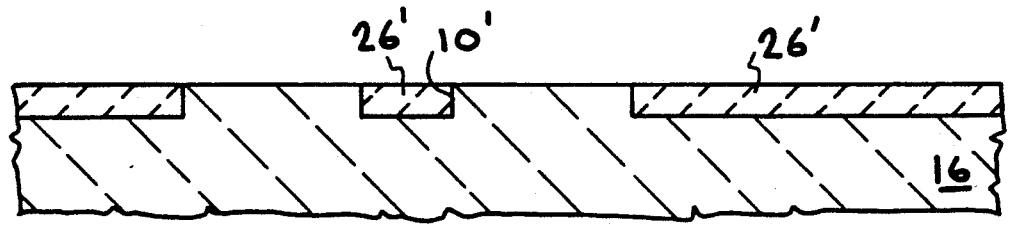

The etched areas 10' are then filled with oxide 26' and etched back, as in the definition/etch back step of the process of the invention and the nitride 80 stripped. The result is shown in FIG. 16a.

In the next process step, a TEOS oxide 28a' is optionally deposited. If done, the thickness of this oxide can be much thinner, as it is no longer the field oxide of the LOCOS process. The thickness may range from about 400 to 1,000 Å; at the lower thickness values, the oxide may be grown rather than deposited. The oxide is needed to prevent shorting of the silicide (on the plug sidewalls) to the junctions under the plugs, as in FIG. 10a.

Figure 9A:
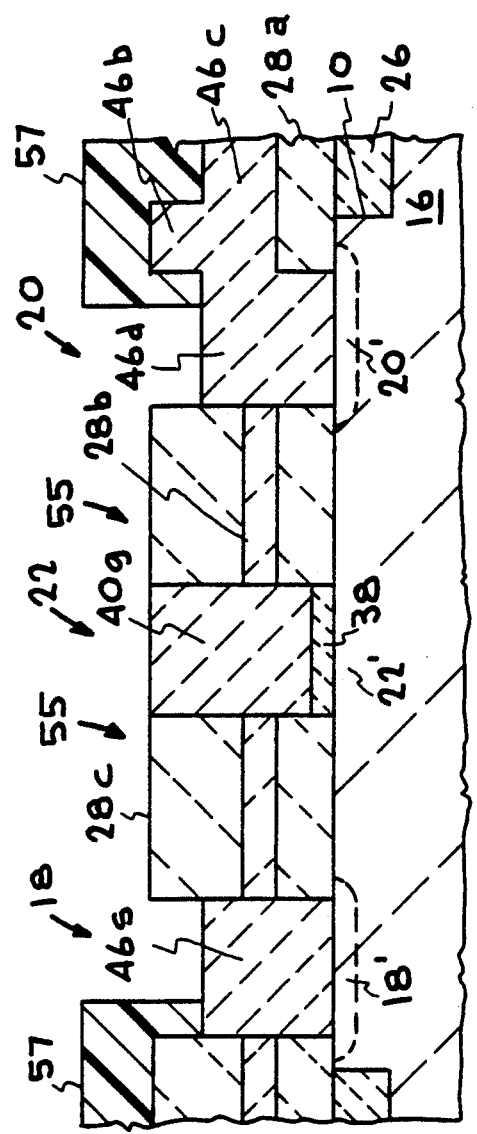
Figure 17A:
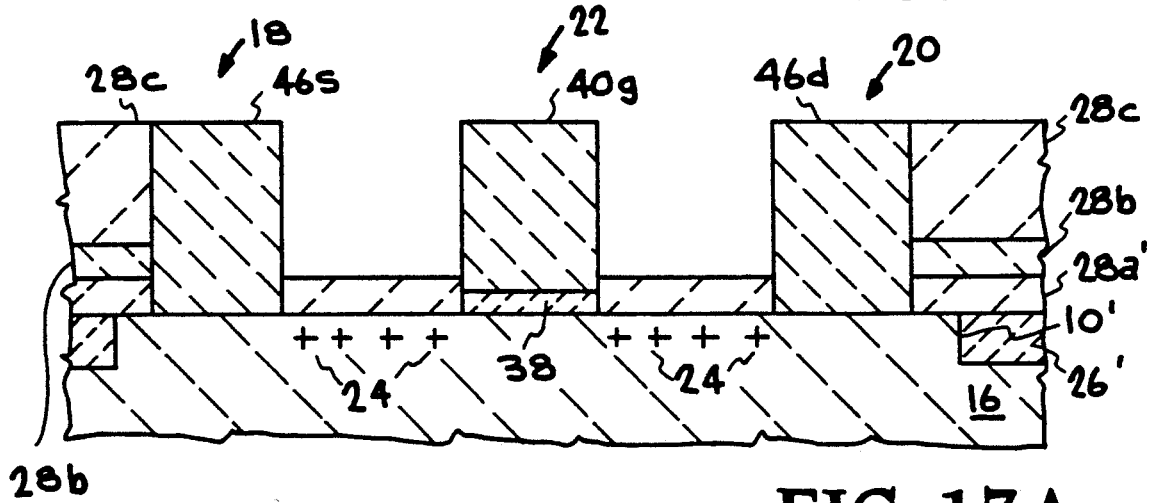

The formation of the multi-layer structure, including the buried etch-stop layer, is identical with that of the invention, providing the nitride 28b, oxide 28c, and polysilicon 28d layers on the underlying oxide 28a' layer. The process is continued to the utilization of the connector mask, etch, and ion implantation, giving rise to the structure depicted in FIG. 17a, which is analogous to that depicted in FIG. 9a. It should be noted that the ability to use a thin oxide layer 28a' on the order of about 400 Å provides an advantage with respect to ion implantation energies for the connectors 24.

It will also be appreciated that the alternate process described with respect to the interconnect 46c gives a much reduced polysilicon interconnect capacitance to the substrate silicon. The reduced height of the plugs (due to reduction of the TEOS field oxide 28a' from about 3,000 to 400 Å) can be used on one of two ways:

1. Reduce the plug height (automatically) from about 1.2 μm to about 0.9 μm; or
2. Increase the thickness of the oxide 28a' by the difference of about 3,000–400 Å such that the plug height after polish is about the same as in the main process of the invention. The etch-back at the anti-contact mask 50 can now be increased from about 4,000 Å to 4,000+(3,000−400) Å, or about 7,000 Å. This is the ultimate (final) thickness between the plug interconnect and the metal to be deposited. It will be appreciated that the plug "height" is constant, but since there is no field oxide (or thin oxide) under the field polysilicon, this permits more etch-back at the anticontact, so that the oxide between the polysilicon and the metal can be thicker, giving reduced capacitance, while still retaining more than 2,000 Å of polysilicon interconnect.

Figure 18A:
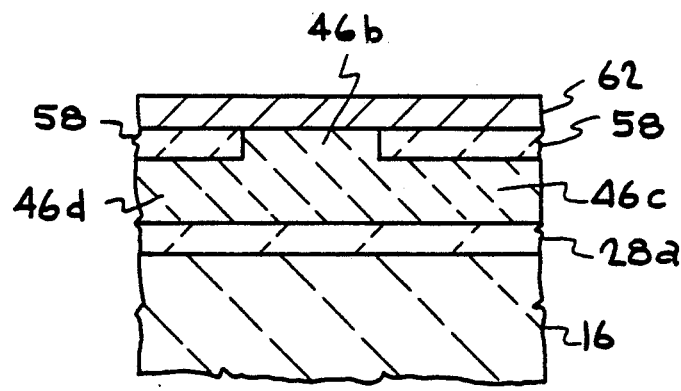
Figure 19A:
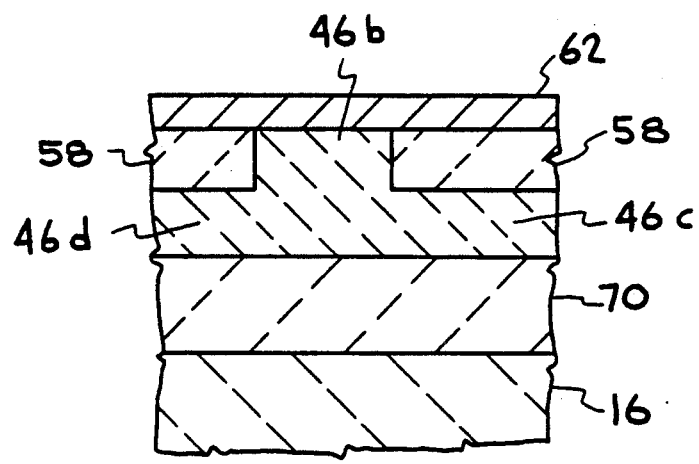

A portion of the structure achieved by the main process of the invention is depicted in FIG. 18a, while the same portion achieved by this alternate process is depicted in FIG. 19a. FIG. 19a shows a recessed LOCOS scheme with a recessed oxide layer 70 and omitting the optional TEOS layer. It will be appreciated that the capacitance between the polysilicon 46c and the overlying metal layer 62 is much reduced with the alternate process, giving a performance advantage.

Finally, the alignment of the connector masks is much less critical for a recessed LOCOS process or similar process. In the main process, the connector masks have to be aligned inside the picture frame oxide 26. In the alternate process, there is much more latitude with respect to the alignment, since the field oxide 28a' is now continuous between devices.

It will be clear to those of skill in the art that other modifications of the LOCOS process may be made to incorporate some or all of the teachings of the present invention. Further, while the disclosure has been directed to field effect transistors, the teachings of the invention are also applicable to bipolar transistors and to combinations of FETs and bipolar devices.

However, it should be remembered that the LOCOS process is well-known for its "bird's beak" problems and that the planarity which may be achieved with the main process of the invention, will not be as good. Planarity may be improved if the LOCOS process is utilized by employing the modification described above known as "recessed LOCOS". In any event, it should be noted that the process of the invention will provide higher packing density of devices than LOCOS processes or modified LOCOS processes.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar or other processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A field effect transistor comprising source, drain, and gate regions formed in a major surface of a semiconductor substrate, said semiconductor substrate provided with (1) source and drain contacts to said source and drain regions, respectively, and (2) a gate electrode overlying a gate oxide overlying said gate region, characterized by
    (a) said source, gate, and drain contacts comprising vertically-disposed plugs comprising a conducting material, disposed in openings formed in insulating material formed on said substrate, said openings defined by substantially perpendicular walls, said conducting material contacting said semiconductor surface in the case of said source and drain contacts and contacting said gate oxide in the case of said gate contact, at least some of which plugs terminate to form a coplanar surface in an area above said substrate surface and substantially parallel to said substrate, at least one of said plugs contacted by a planar contact;
    (b) at least two of said plurality of plugs having a similar lateral dimension in at least one direction parallel to said substrate at said major surface; and
    (c) said insulating layer comprising a multilayer structure comprising
        (1) a first layer consisting essentially of an oxide,
        (2) a second layer consisting essentially of an etch-stop material having a significantly different etch rate than said oxide of said first layer, and
        (3) a third layer consisting essentially of an oxide.

2. The transistor of claim 1 wherein said conducting material comprises doped or undoped polysilicon.

3. The transistor of claim 2 wherein said doped polysilicon material is selected from the group consisting of N+ and P+ doped material.

4. The transistor of claim 2 wherein at least some of said polysilicon plugs include a silicided outer layer to control vertical series resistance thereof.

5. The transistor of claim 4 wherein N+ and P+ polysilicon plugs are shunted together by said silicide to form an ohmic interconnect.

6. The transistor of claim 4 wherein said source and drain regions are contacted by said polysilicon plugs, said polysilicon plugs including said silicided outer layer to control the vertical series resistance of said plugs.

7. The contacts of claim 1 wherein said semiconductor substrate comprises silicon, said first layer consists essentially of silicon dioxide, said second layer consists essentially of silicon nitride, and said third layer consists essentially of silicon dioxide.

8. The contacts of claim 7 wherein said first layer of silicon dioxide is about 2,500 Å thick.

9. The contacts of claim 7 wherein said first layer of silicon dioxide is about 400 Å thick.

10. The field effect transistor of claim 1 wherein at least one of said plugs is connected by a planar interconnect on a plane, which is above said semiconductor substrate and which is below said planar contact, to at least one plug of a neighboring field effect transistor.

11. A CMOS device comprising source, drain, and gate regions formed in a major surface of a semiconductor substrate, said semiconductor substrate provided with (1) source and drain contacts to said source and drain regions, respectively, and (2) a gate electrode overlying a gate oxide overlying said gate region, characterized by
    (a) said source, gate, and drain contacts comprising vertically-disposed plugs comprising a conducting material, disposed in openings formed in insulating material formed on said substrate, said openings defined by substantially perpendicular walls, said conducting material contacting said semiconductor surface in the case of said source and drain contacts and contacting said gate oxide in the case of said gate contact, at least some of which plugs terminate to form a coplanar surface in an area above said substrate surface and substantially parallel to said substrate, at least one of said plugs contacted by a planar contact;
(b) at least two of said plurality of plugs having a similar lateral dimension in at least one direction parallel to said substrate at said major surface; and
(c) said insulating layer comprising a multilayer structure comprising said insulating layer comprising a multilayer structure comprising
(1) a first layer consisting essentially of an oxide,
(2) a second layer consisting essentially of an etch-stop material having a significantly different etch rate than said oxide of said first layer, and
(3) a third layer consisting essentially of an oxide.

12. The CMOS device of claim 11 wherein at least one of said plugs is connected by a planar interconnect on a plane, which is above said semiconductor substrate and which is below said planar contact, to at least one plug of a neighboring CMOS device.

13. The device of claim 11 wherein said polysilicon material is selected from the group consisting of N+ and P+ doped material.

14. The device of claim 11 wherein at least some of said polysilicon plugs include a silicided outer layer to control vertical series resistance thereof.

15. The device of claim 14 wherein N+ and P+ polysilicon plugs are shunted together by said silicide to form an ohmic interconnect.

16. The device of claim 14 wherein said source and drain regions are contacted by said polysilicon plugs, said polysilicon plugs including said silicided outer layer to control the vertical series resistance of said plugs.

17. The contacts of claim 11 wherein said semiconductor substrate comprises silicon, said first layer consists essentially of silicon dioxide, said second layer consists essentially of silicon nitride, and said third layer consists essentially of silicon dioxide.

18. The contacts of claim 17 wherein said first layer of silicon dioxide is about 2,500 Å thick.

19. The contacts of claim 17 wherein said first layer of silicon dioxide is about 400 Å thick.

* * * * *